US006288814B1

(12) United States Patent
Blauvelt

(10) Patent No.: US 6,288,814 B1
(45) Date of Patent: *Sep. 11, 2001

(54) IN-LINE PREDISTORTER FOR LINEARIZATION OF ELECTRONIC AND OPTICAL SIGNALS

(75) Inventor: Henry A. Blauvelt, San Marino, CA (US)

(73) Assignee: Ortel Corporation, Alhambra, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/139,624

(22) Filed: Aug. 25, 1998

Related U.S. Application Data

(63) Continuation-in-part of application No. 08/757,485, filed on Nov. 27, 1996, now Pat. No. 5,798,854, which is a continuation of application No. 08/481,073, filed on Jun. 7, 1995, now abandoned, which is a continuation-in-part of application No. 08/245,878, filed on May 19, 1994, now abandoned.

(51) Int. Cl.$^7$ .............................. H04B 10/18; H04B 10/04
(52) U.S. Cl. ........................................... 359/180; 359/161
(58) Field of Search ..................... 359/180, 187, 359/161

(56) References Cited

U.S. PATENT DOCUMENTS

| 4,890,300 | * 12/1989 | Andrews | 375/297 |
|---|---|---|---|
| 4,902,983 | * 2/1990 | Fujiki et al. | 330/149 |
| 4,992,754 | 2/1991 | Blauvelt et al. | 330/149 |
| 5,049,832 | 9/1991 | Cavers | 330/149 |
| 5,161,044 | 11/1992 | Nazarathy et al. | 359/157 |
| 5,363,056 | 11/1994 | Blauvelt et al. | 330/149 |
| 5,378,937 | * 1/1995 | Heidenann et al. | 327/306 |
| 5,381,108 | 1/1995 | Whitmarsh | 330/2 |
| 5,418,637 | 5/1995 | Kuo | 359/161 |
| 5,424,680 | 6/1995 | Nazarathy et al. | 330/149 |
| 5,477,367 | 12/1995 | van der Heijden | 359/180 |
| 5,523,716 | * 6/1996 | Grebliunas et al. | 330/149 |
| 5,589,797 | 12/1996 | Gans et al. | 330/149 |
| 5,600,472 | * 2/1997 | Uesaka | 359/161 |
| 5,798,854 | * 8/1998 | Blauvelt et al. | 359/161 |
| 5,939,920 | * 8/1999 | Hiraizumi | 327/306 |
| 6,018,266 | * 1/2000 | Wu | 330/149 |

OTHER PUBLICATIONS

M. Bertelsmeier, "Linearization of Optical Transmitters for the Transmission of Analog Signals via Light Wave Conductors," Department of Science of Electrical Communications Technological Institute, Darmstadt, Germany, Sections 2.4—7.1.1, 1984.

* cited by examiner

Primary Examiner—Leslie Pascal
(74) Attorney, Agent, or Firm—Christie, Parker & Hale, LLP

(57) ABSTRACT

An electronic circuit provides a substantially linear output from a nonlinear transmission device such as a laser. The input signal to the nonlinear device is applied to an in-line electrical path coupled to the nonlinear device. In the in-line predistorter of the present invention, the desired real and imaginary distortion terms may be synthesized by summing the distortion contributions from several different distorter elements. In the simplest case, one distorter produces a constant real distortion, another produces distortion proportional to frequency, f, and so on. However, it is not essential to have the simplest set of distorters. Distorters with more complex distortion characteristics can be used so long as they provide an independent set. A number of circuits are disclosed that can be combined to provide the building blocks of an in-line circuit.

13 Claims, 12 Drawing Sheets

IN-LINE PREDISTORTER FOR LINEARIZATION OF ELECTRONIC AND OPTICAL SIGNALS

REFERENCE TO RELATED APPLICATIONS

This application is a continuation-in-part of application Ser. No. 08/757,485, filed Nov. 27, 1996, now U.S. Pat. No. 5,798,854; which is a continuation of application Ser. No. 08/481,073, filed Jun. 7, 1995, abandoned; which is a continuation-in-part of application Ser. No. 08/245,878; filed May 19, 1994, abandoned, the contents of which are hereby incorporated by reference.

FIELD OF THE INVENTION

This invention relates to an electronic circuit for providing a linear output from an amplitude modulated transmission device such as a semiconductor laser which has an output distorted from its input due to inherent nonlinearity. The distortion of the nonlinear device is compensated by applying a predistorted signal to the input of the nonlinear device. The predistortion is chosen such that the distortion of the nonlinear device restores the undistorted signal.

BACKGROUND

Directly modulating the analog intensity of a light-emitting diode (LED) or semiconductor laser with an electrical signal is considered among the simplest methods known in the art for transmitting analog signals, such as sound and video signals, on optical fibers. Although such amplitude modulation techniques have the advantage of significantly smaller bandwidth requirements than baseband digital modulation or frequency modulation, amplitude modulation may suffer from noise and nonlinearity introduced by the optical source.

Distortion inherent in certain analog transmitters prevents a linear electrical modulation signal from being converted linearly to an optical signal, and instead causes the signal to become distorted. These effects are particularly detrimental to multi-channel video transmission which requires excellent linearity to prevent channels from interfering with one another. A highly linearized analog optical system has wide application in CATV, interactive TV, and video telephone transmission, for example.

Linearization of optical and other nonlinear transmitters has been studied for some time, but proposed solutions suffer from practical disadvantages or cost penalties that limit usefulness to high value devices. Feedforward techniques, for example, require complex system components such as optical power combiners and multiple optical sources.

One method employed in the past to reduce distortion inherent in nonlinear devices has been predistortion. In this technique, a modulation signal is combined with a signal equal in magnitude to the distortion inherent in the nonlinear device but opposite in sign. When the nonlinear device is modulated by the combined signal, the device's inherent distortion is canceled by the distortion signal generated by the predistortion, and only the linear part of the source signal is transmitted. The intermodulation products in the predistortion signal are at frequencies that are additive and subtractive combinations of integer multiples of the input frequencies. In the distribution of AM signals for cable television, for example, there are often as many as 80 frequencies on a particular band and plenty of opportunities for second order and third order intermodulation products of those frequencies.

Current predistortion techniques generally divide an input signal into two or more electrical paths and generate predistortion on one or more of the paths resembling the distortion inherent in the nonlinear transmitting device. The generated predistortion is the inverse of the nonlinear device's inherent distortion and serves to cancel the effect of the device's inherent distortion when recombined with the input signal before application to the nonlinear device.

Advanced multi-path predistortion circuits are flexible and highly effective for linearizing output of a wide range of nonlinear devices. One such multi-path predistortion circuit is disclosed in U.S. Pat. No. 4,992,754, issued to Blauvelt et al. The circuit is capable of generating frequency specific distortion products for compensating frequency-dependent nonlinearities, and is useful for applications requiring an exceptionally high degree of linearity, such as, for example, CATV applications.

Although multi-path predistortion circuits can be used in a broad variety of applications, the design of these circuits is relatively complex. This complexity manifests itself in circuits that are often too expensive for applications needing only a modest degree of linearization. One skilled in the art would appreciate a low-cost circuit of relatively simple design for limited application, particularly if such a circuit were fabricated from existing low-cost components commonly used in signal transmission applications.

Those skilled in the art would also appreciate a circuit that could produce frequency dependent third-order distortion. Simple third-order distortion, such as that produced by an ideal diode, has the property that the distortion is real and independent of frequency. Many non-linear transmitters or amplifiers, however, contain reactive elements such as inductances, capacitances or delays, which cause the device to produce distortion depending on the input and output frequencies and the distortion frequencies. Nazarathy, U.S. Pat. No. 5,161,044, discloses a circuit in FIG. 15 of that patent which produces essentially real, frequency-independent predistortion. The capacitors and inductors in Nazarathy are added for biasing purposes and to block the DC and AC currents. However, the circuit disclosed by Nazarathy may not have the right phase or frequency dependence for each set of input frequencies, to be substantially the same in magnitude and opposite in sign to the distortion produced by the non-linear device.

The present invention accordingly is addressed to a low-cost predistortion circuit reducing second and higher order distortion products produced by a nonlinear device and to a circuit for generating frequency dependent third-order distortion.

SUMMARY

Thus, in practice of this invention according to one embodiment, an in-line predistortion circuit is provided for reducing distortion in the transmission of analog signals. The distortion so generated, or predistortion, is adjusted to be substantially equal in magnitude and opposite in sign to the second or higher order intermodulation product distortion inherent in a nonlinear modulation device to which the signal is applied. The real component of the predistortion signal is produced by a first device such as an amplifier, and is adjusted in amplitude to match the amplitude of the distortion by the nonlinear device. The imaginary component of the predistortion signal is adjusted through introduction of a distortion signal out of phase with the real component of the predistortion signal on the in-line electrical path. The real and imaginary components are combined to produce a single modulation signal including intermodulation product distortion for application to the nonlinear device. The in-line predistortion circuit largely linearizes the transmission of modulating signals by canceling distortion inherent in nonlinear transmitting devices and can be formed with commonly-used, low-cost components.

In an alternate embodiment, the real component of the predistortion signal is produced by a FET configured as a voltage-controlled resistor, connected from the RF signal path to ground. In another embodiment, the real component of predistortion is produced by the parallel combination of a diode and a resistor connected in series with the RF signal path. The magnitude of the predistortion produced by these devices is adjustable by changing the DC bias current supplied to the device.

In another alternate embodiment, a separate predistortion circuit is provided for generating frequency-dependent third-order distortion. Frequency dependent third-order distortion is generated by the combination of a pair of antiparallel diodes with reactive circuit elements and delays. The magnitude of the predistortion produced by this circuit is adjustable by changing the DC bias current supplied to the diodes.

In the in-line predistorter of the present invention, the desired real and imaginary distortion terms may be synthesized by summing the distortion contributions from several different distorter elements. In the simplest case, one distorter produces a constant real distortion, another produces distortion proportional to frequency, f, and so on. However, it is not essential to have the simplest set of distorters. Distorters with more complex distortion characteristics can be used so long as they provide an independent set. Accordingly, there are disclosed additional "building block" circuits for obtaining desired distortion characteristics.

By way of example, a Schottky diode connected in parallel with a resistance element in the main RF signal path ideally produces distortion that is generally in phase with the voltage across it. As another example, a varactor connected between the RF signal path and ground, ideally produces complementary distortion that varies as a function of frequency and is 90 degrees out of phase with the voltage applied to it. By configuring different in-line circuits that include the basic components, it is possible to generate distortion that is sufficient to compensate for the non-linear characteristics of most devices used for the transmission of broadband signals.

BRIEF DESCRIPTION OF THE DRAWINGS

These and other features and advantages of this invention will be better understood and more fully appreciated by reference to the following detailed description when considered in conjunction with the accompanying drawings, wherein:

FIGS. 12–16 are diagrams of circuits for generating primarily second order distortion;

FIGS. 17–21 are diagrams of circuits for generating primarily third order distortion.

DETAILED DESCRIPTION

Figure 6:
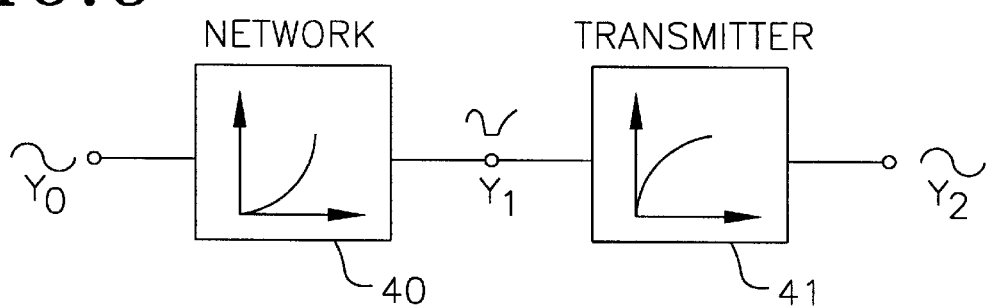
FIG. 6 is an illustration of the effect of predistortion on the waveforms of a modulated signal.

The concept of predistortion is shown abstractly in FIG. 6. An input signal Y0 is input to a predistortion network 40 The predistortion network has a nonlinear transfer function which deviates from linearity oppositely and inversely from the deviation of a nonlinear transmitter having a known transfer function 41. The signal Y1 from the predistortion network is a combination of the input source signal Y0 and predistortion resulting from the nonlinear transfer function in the predistortion network 40. Signal Y1 is fed into the nonlinear transmitter and, after modulation by the transmitter, appears as a substantially linear signal Y2 as a result of the inherent distortion of the transmitter inversely related to and canceled by the predistortion of signal Y1.

Figure 7:
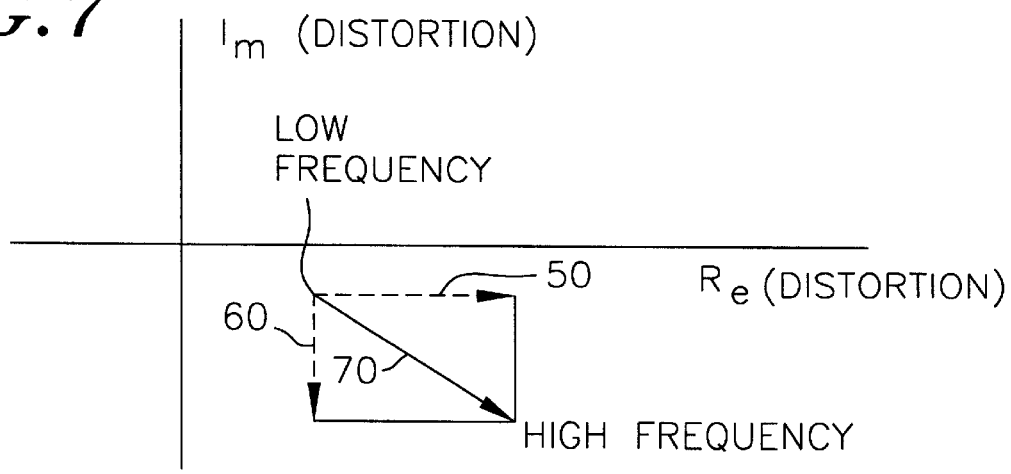
FIG. 7 is an illustration of the real and imaginary vector components of distortion.

The distortion generated by an exemplary nonlinear device is shown graphically in FIG. 7. The graph shows a polar display of the real component 50 and imaginary component 60 of distortion which are combined to form a distortion vector 70. Using conventional notation, input signals $$e^{iw_1 t} \tag{1}$$

and $$e^{iw_2 t} \tag{2}$$

cause second order distortion products defined by the equation:

$$Ae^{i(w_1 + w_2)t + \theta} \tag{3}$$

The real component of the distortion, i.e., the vector component of the distortion signal along the real axis (0° phase angle), is $A\cos\theta$; the imaginary component of the distortion, i.e., the vector component of the distortion signal along the imaginary axis (90° phase angle), is $A\sin\theta$. To provide linearized output from a nonlinear device, both the real and imaginary components of distortion in the nonlinear device should be canceled. This is done by applying real and imaginary predistortion components varying inversely and oppositely from those produced by the nonlinear device.

Figures 1, 2:
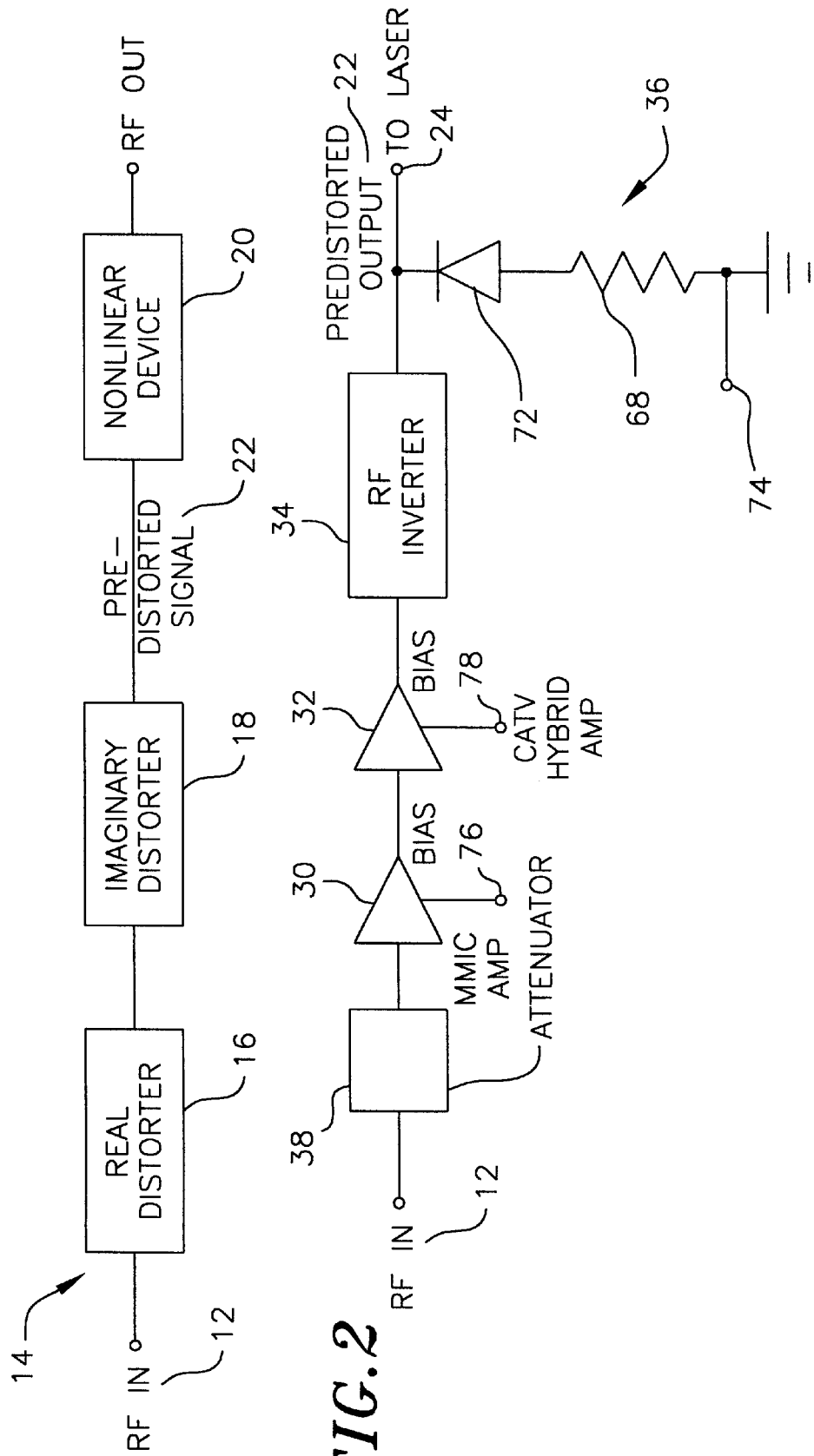
FIG. 1 is a block diagram showing the general features of an in-line predistortion circuit according to the present invention.
FIG. 2 is a block diagram showing an embodiment of an inline predistortion circuit.

Referring now to FIG. 1, in an exemplary in-line predistorter circuit according to the present invention, an input source signal 12 feeds into an in-line electrical path 14. By in-line electrical path, it is meant that the input source signal is passed through a single distortion producing path as opposed to being split between two or more separate paths connected in parallel. The in-line electrical path comprises in series a real distortion component generator 16 for generating primarily real distortion components and an imaginary distortion component generator 18 for generating primarily imaginary distortion components. Ideally, the combined distortion from the generators, applied to the nonlinear device, is equal and opposite to the distortion produced by the nonlinear device 20 to which the predistorted input source signal 22 is applied. The real distortion generator may include some imaginary component, and the imaginary distortion generator may have some real component. These are included when forming the vector sum of the real and imaginary components to match the distortion of the nonlinear device.

FIG. 2 illustrates an exemplary embodiment of a practical in-line predistorter circuit including, serially, a monolithic microwave integrated circuit (MMIC) amplifier 30, a CATV hybrid amplifier 32, an RF inverter 34, and a varactor 36 preceding a nonlinear device such as a laser. The signal on the in-line path feeds first into a single-ended amplifier, e.g., the MMIC amplifier, for generating primarily real components of predistortion. The MMIC amplifier is a low-cost component commonly used in RF circuit designs. The MMIC has the advantage of low cost, but similar performance is obtained from amplifiers built as hybrid integrated circuits or built from discrete components. The output of the MMIC amplifier comprises the amplified input fundamental frequencies and intermodulation distortion of the input signal frequencies. Primarily second order intermodulation products are produced by the MMIC amplifier.

The amplitude of the real component of the distorted output from the MMIC amplifier is preferably matched in amplitude to the amplitude of the real component of the inherent distortion predicted in the nonlinear transmission device. However, the MMIC amplifier has been found to exhibit distortion characteristics only proportional to those of a nonlinear laser and may need adjustment. The distortion from the MMIC amplifier is generally of larger magnitude than that produced by the nonlinear laser for equal input signal levels. To match distortion amplitudes, the output signal level from the MMIC must be lower than the input signal level to the laser. This requires using a gain block between the MMIC and the laser. It may also be required to introduce attenuation through the attenuator 38 before the MMIC to have each component operating at the current signal level.

Due to its low cost, wide use in coaxial distribution networks, and linear output over input frequencies of interest, the CATV hybrid amplifier 32 is suitable for boosting the output signal of the MMIC amplifier. The CATV amplifier produces negligible distortion over most low to moderate signal levels. At high signal levels, the CATV amplifier may exhibit distortion. However, this is not a problem because the signal levels at which distortion occurs are generally higher than those of interest for modulation of a typical nonlinear laser device.

The amount of attenuation and the CATV amplifier gain may be varied as necessary to produce distortion products in the input modulation signal. The magnitude of distortion in the MMIC is determined by the strength of the input signal. The distortion is greater at high signal strengths. Thus, if a greater distortion is desired, the input signal may be attenuated less and the gain of the CATV hybrid amplifier reduced. Likewise, the bias on the MMIC amplifier and CATV amplifier may be adjusted for varying the relative amplitude of distortion. By driving the MMIC amplifier harder, a larger distortion is obtained (relative to the signal strength) than if the input signal is smaller.

The predistorted signal adjusted to the proper level by the CATV amplifier is inverted, if necessary, in the RF invertor 34 to provide a signal that can be used to cancel the real component of the distortion in the nonlinear device.

The imaginary component of the predistortion signal is primarily generated in the exemplary embodiment by the varactor 36, formed in a typical embodiment by a resistor 68 and diode 72 connected to ground. The varactor, which has a capacitance which varies with voltage, produces harmonic distortion products that increase with the square of frequency of the input signal and are 90° out of phase with the fundamental signals. When the varactor is used without a resistor, the distortion generated is purely imaginary, increasing in amplitude in proportion to the frequency of the distortion signal. Including the resistor introduces a small real component that can be varied by varying the value of the resistor.

The imaginary component of the predistortion signal created by the varactor is controlled by varying the voltage to the varactor input 74 from an external source. As the voltage is increased, lower distortion is produced due to the smaller variation of capacitance with voltage at higher reverse bias. At lower voltages, the diode exhibits greater distortion. This adjustment in the varactor, like the amplitude adjustment, may also be made manually br automatically. Assuming a simple sine wave input on the in-line path through the varactor, the peaks of the sine wave would shift forward in time, and the valleys backward.

Although it is primarily used to generate real distortion components, the MMIC amplifier may have various mechanisms for distortion, some of which may be frequency dependent and some of which shift the phase of the distortion. Different mechanisms may predominate at different bias voltages. By varying the bias voltage to the amplifiers through bias inputs 76, 78 and the input voltage to the varactor at input 74, the distortion can be adjusted as necessary in most cases to compensate the nonlinear device.

It is found that manual adjustment of amplitude, frequency and phase is usually completed in less than a few minutes. What one does is make an appropriate adjustment while observing the distortion in the output of the nonlinear device. The adjustment seeks to minimize the final distortion of the nonlinear device. The optimum adjustment is when the predistortion signal is of the same magnitude as the distortion inherent in the nonlinear device, and the predistortion is exactly 180° out of phase with the distortion. Such an adjustment may also be made automatically through the use of a feedback control circuit, for example. If the nonlinear characteristics of a particular device are known in advance or measurable, the bias voltages of the MMIC amplifier, CATV amplifier and the varactor can be electronically tuned even more rapidly.

Once the real and imaginary components of the predistortion signals on the in-line electrical path have been set, the signal is output to a nonlinear transmission device for modulation of the signal.

Figure 3:
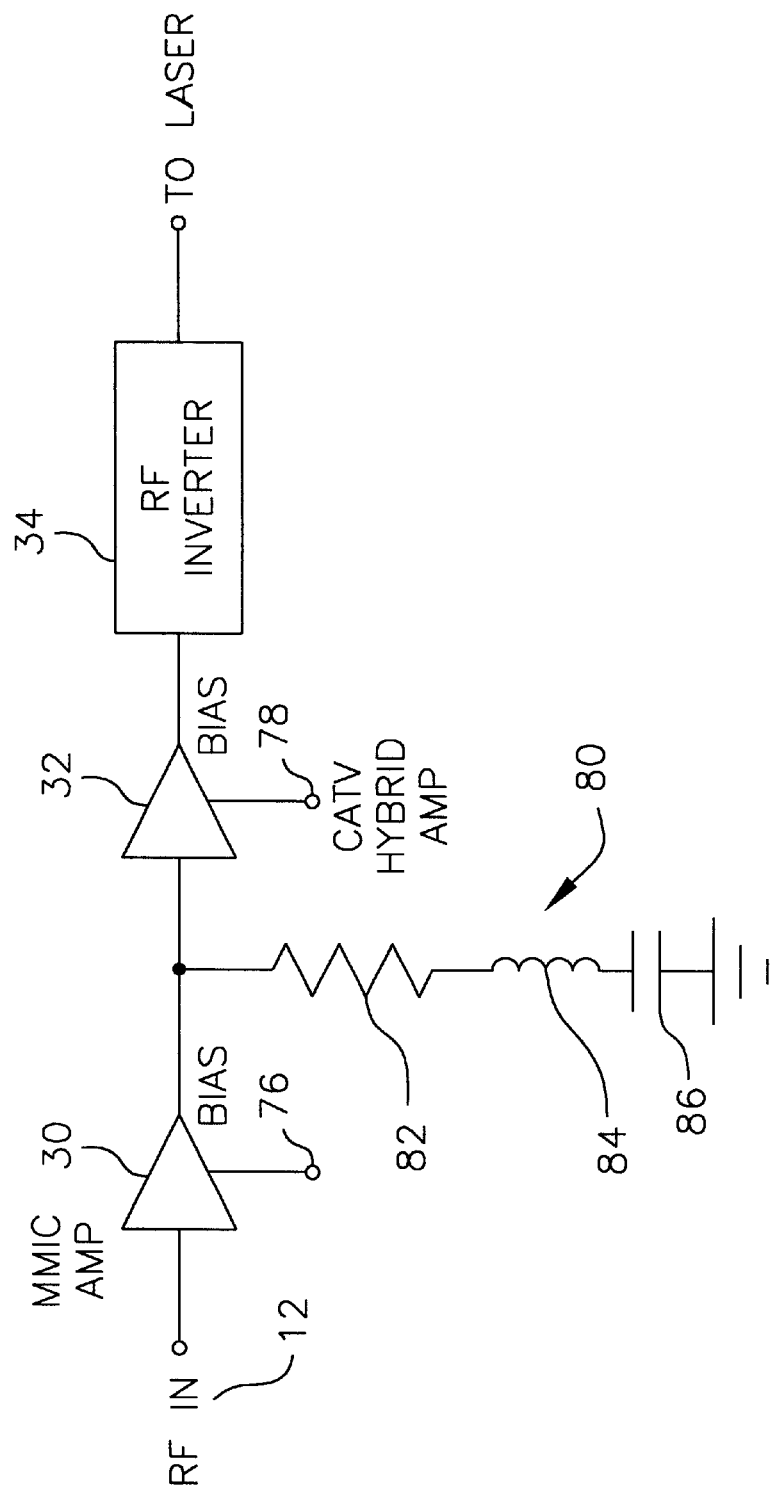
FIG. 3 is a block diagram of an alternate embodiment of the in-line predistortion circuit of FIG. 2.

The exemplary embodiment described is useful for a variety of nonlinear device applications, but in some cases requiring greater linearity, different or additional components may be necessary on the in-line path. For example, in some cases, the circuit illustrated in FIG. 2 may not produce distortion products with phases that exactly match that of the nonlinear device across the band. Simply varying the bias of the components of a circuit such as illustrated in FIG. 2 may be insufficient to achieve the desired linearization. A reactive circuit such as illustrated in FIG. 3 may be used to correct such a phase difference. The circuit of FIG. 3 has a relatively flat amplitude response and a nonlinear phase response caused by the LRC combination 80 including a resistor 82, an inductor 84, and a capacitor 86. Other all-pass filter circuits with substantially more nonlinear phase responses can also be used, but at somewhat greater cost.

In the simple approach to in-line predistortion, the predistorter comprises individual building blocks with their signals summed to give the desired linearization signal. Among the basic building blocks are series and shunt forward biased diodes, transistors, single-ended amplifiers, CATV amplifiers, and varactor diodes. These blocks can be used as single distorter elements or in combination with passive components such as resistors, capacitors, and inductors. In many cases, however, it is not possible to synthesize the correct predistortion signal from individual blocks. For example, an exemplary transmission device may be a semiconductor laser or LED modulated by the output signal. The inherent distortion of such a device often is not independent of frequency. Generally speaking, the distortion is inherently greater at higher frequencies. In such cases, a combination of various elements or basic groups of elements, each forming a stage, may be necessary.

Figure 4:
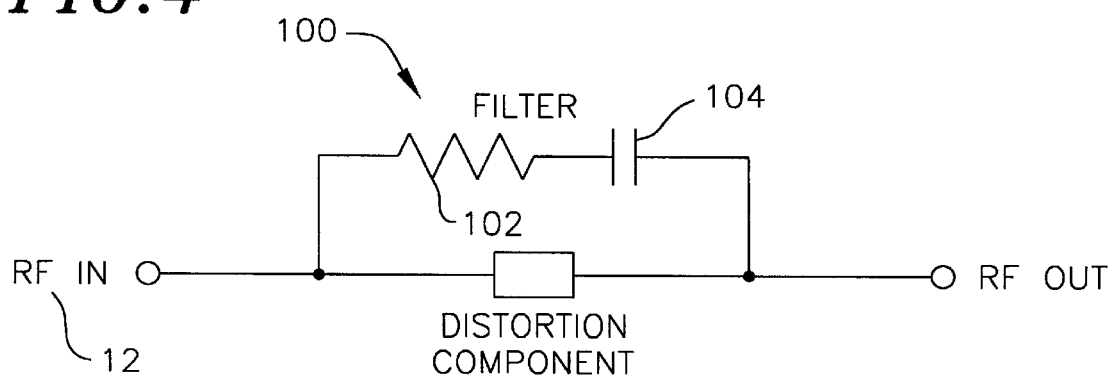
FIG. 4 is a schematic diagram of an intrastage filter employed in a predistortion circuit.

One or more filters can be used within a single stage or between stages to tailor the performance of the in-line predistorter for a particular application. For example, to adjust for frequency dependent distortion of the nonlinear transmitting device, the output of the amplitude adjustment block is fed into a frequency adjustment or "tilt" adjustment intrastage filter 100 as illustrated in FIG. 4. The tilt adjustment is a variable filter such as a variable resistor 102 and capacitor 104 in a feedback loop or other similar means which increases the amplitude of the distortion at high frequencies for an "up-tilt". Similarly, feedback may be used in an intrastage filter for decreasing distortion at higher frequencies for a "down-tilt." This adjustment, like the amplitude adjustment, may be done either manually or automatically.

Figure 5:
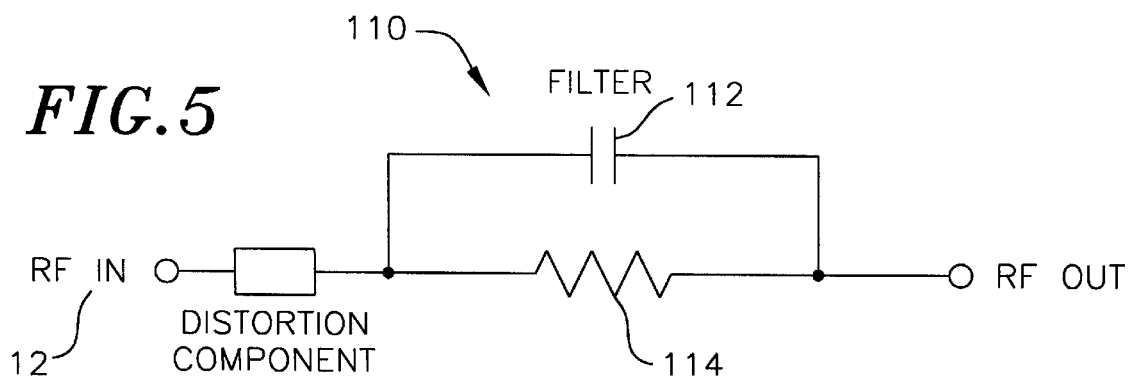
FIG. 5 is a schematic of an interstage filter employed in a predistortion circuit.

Frequency dependence of the signal from the predistortion components may also be compensated via an interstage filter 110 as illustrated in FIG. 5. In this embodiment, more high frequency distortion passes the resistor 114 and capacitor 112, thereby providing an up-tilt of predistortion. By passing more or less of the high frequency distortion products than the low frequency distortion products, the tilt adjustment enables the predistortion signal to be tailored more precisely to the inherent distortion characteristics of the nonlinear device.

Typically, the amplitude adjustment is made to compensate for the distortion occurring at the low frequency end of the band. The frequency adjustment is then made as an up-tilt to compensate for distortion at the high frequency end of the band. It may be noted that this same effect can be achieved by amplitude adjustment at the high frequency end, and an up-tilt or down-tilt on the low-frequency end as an appropriate attenuation or amplification of the signal.

All of the embodiments hereinabove described have been strictly in-line wherein each of the distorters is effectively in series with a non-linear device or with other predistortion components. In other words, the entire fundamental signal is operated upon by the predistorting component or components. Even the embodiment in FIG. 4 which appears in the drawing to have components in parallel simply has a distorter coupled to a filter which may include a parallel signal path or a series signal path, as illustrated in FIG. 5.

Figure 8:
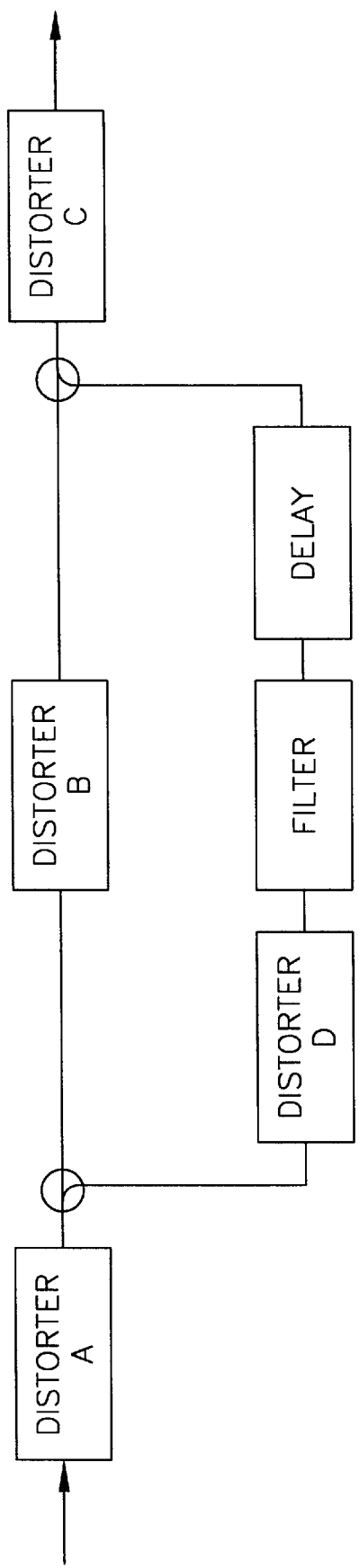
FIG. 8 is a schematic diagram of a hybrid predistortion circuit.

It may be advantageous to employ inexpensive in-line distortion components at least partly in parallel in some embodiments. The distortion produced in the parallel path or paths may be additive and provide greater adjustability. An exemplary arrangement of multiple distorters is illustrated in FIG. 8.

In this embodiment, an input signal 12 is fed into an in-line electrical path having a number of predistortion components A, B and C in circuit series. These distorters are symbolic of any number of such predistortion components which may be included in the in-line path, with each contributing a real or imaginary component of distortion in selected frequency ranges, for example, which cumulatively produce a predistorted output signal which may be employed for canceling distortion in a nonlinear device downstream from the predistortion circuit illustrated.

In some applications it may be desirable to include a splitter 41 in the signal path for extracting a portion of the signal and applying it to an additional distorter D in a parallel path. The parallel path may also include a filter 43, as described above. A delay 44 is also included in the parallel path (or in principal path, as appropriate) so that the combined distortions from the two paths best match the distortion characteristics of the transmission device.

In the illustrated embodiment, the splitter 41 and coupler 46 are located between some of the distortion components in the in-line path. This is merely emblematic, and the parallel path may be located in essentially any sequence with the other distorters.

In such an embodiment, the parallel distortion path including the distorter D may be employed as a coarse compensation adjustment. Typically, there would be only amplitude adjustment in the parallel distortion path although it is quite feasible to have tilt adjustment as well. Typically, the filter and delay may be fixed to be appropriate for most of the output devices expected to be served by the predistortion circuit. The in-line distortion components A, B, C, etc. are used as fine alignment elements.

As illustrated, three such predistortion devices are in-line but there may be more or less and they may be placed anywhere in the principal signal path. Suitable amplifiers or attenuators may also be spaced along the signal path for providing the optimum RF level for each of the in-line distorters. The parallel path may include more than one distortion component. For example, both a MMIC amplifier and a varactor may be present for both real and imaginary components of distortion. Such additional distorters may both be in one parallel path, or may be in more than one parallel path.

An advantage of a hybrid design having in-line distortion with real and imaginary components and a parallel path for coarse predistortion is that the varactors and MMIC amplifiers are quite easily automatically adjusted to provide optimum predistortion for a selected output device. Thus, an in-line predistorter with a parallel path for coarse predistortion may be both more economical and more easily automatically adjustable than a more sophisticated predistorter with parallel paths for generating second and third order predistortion components.

Another advantage of such an arrangement is that distortion adjustments can be made in the parallel path with virtually no effect on the fundamental signal. A disadvantage is the spitter and coupler needed for the parallel path or paths. Additional amplifiers may be required to compensate for signal losses in the parallel paths. Thus, such an arrangement may have increased cost, complexity, size and power consumption. It may therefore not be desirable for other than specialized applications.

An advantage of a purely in-line predistorter is that there is no need to assure that the signal in a parallel path is in phase with the signal in the principal path when the signals are recombined. Furthermore, an amplifier is ordinarily used in the circuit and the MMIC amplifier or the like may be used as both the required amplifier and means for producing desired predistortion.

Many variations and modifications will be apparent to those skilled in the art without departing from the spirit and scope of the invention. Many components may be used to form a distortion generating stage, including, for example, transistors or diodes. Any groups of distortion stages may be manipulated with filter stages to provide a desired predistortion signal to the nonlinear device.

Figure 9A:
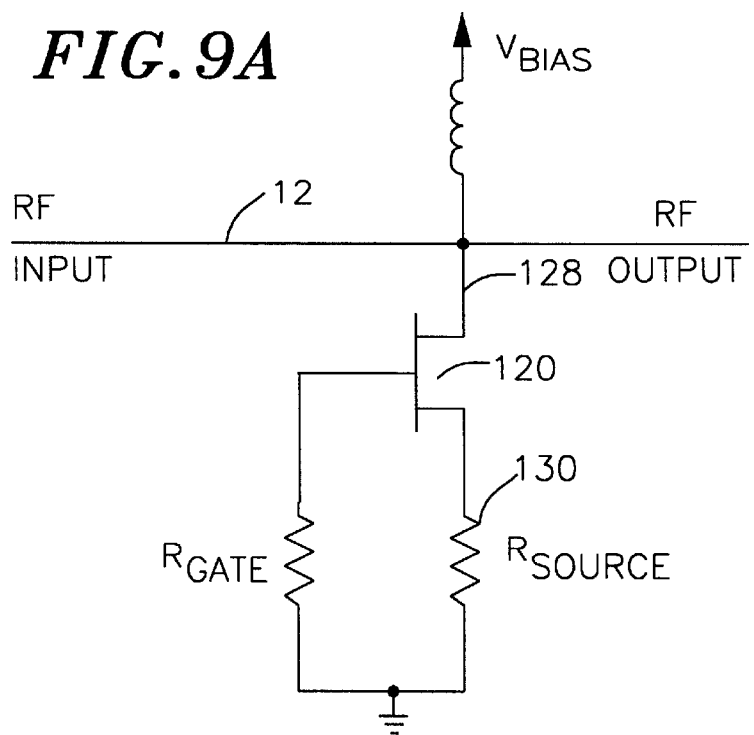
FIG. 9A is a schematic diagram of a circuit including a FET configured as a voltage controlled resistor for producing primarily a real component of predistortion.
Figure 9B:
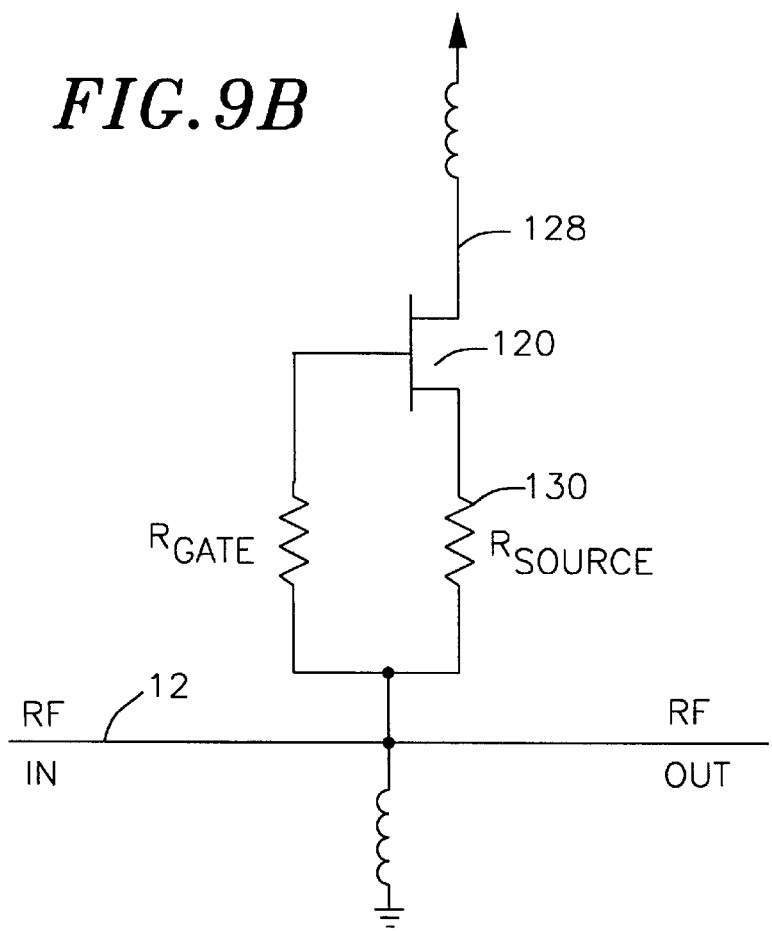
FIG. 9B is an alternate embodiment of the circuit of FIG. 9A.

Also, a number of different devices may be used to generate the in-line predistortion. Referring to FIGS. 9A and 9B, in an alternate embodiment of the present invention, the real component of predistortion is by a FET 120 configured as a voltage controlled resistor connected to the RF signal path and to ground. Like reference numerals are used to designate like components in FIGS. 9A and 9B. Referring to FIG. 9A, as the voltage at the drain 128 is increased, the drain current increases. The drain current is not linearly proportional to the drain voltage, however, because of the non-linear dynamics of the FET and also because the changing source current flows through the source resistor 130, causing the gate-source voltage to change. Since the drain current is a non-linear function of the drain voltage, the RF insertion loss is modulated by the RF signal, causing predistortion. The amount of predistortion can be adjusted by varying the DC bias current through the FET. Typically the differential resistance increases with increased bias current. Consequently, a positive voltage swing in the RF signal will momentarily decrease the insertion loss.

Referring to FIG. 9B, this predistortion circuit also contains a FET configured as a non-linear resistor, but in this configuration the RF signal is applied to the opposite end of the non-linear resistor, so that a positive voltage swing in the RF signal will momentarily increase the insertion loss. Accordingly, the circuit of FIG. 9B produces distortion opposite in sign to the distortion produced by the circuit of FIG. 9A.

In order for either of the circuits of FIG. 9A or 9B, to produce primarily second-order distortion, the RF signal level must be sufficiently low, since higher-order distortion increases more rapidly with increasing RF level than does second-order distortion. As for elements of the circuits, GaAs microwave FETs have been found to produce satisfactory results. Typical values of gate and source resistance are 50 ohms and 10 to 30 ohms, respectively, but the resistances chosen should be such that a real component of predistortion is generated that is suitable for compensating distortion produced by the nonlinear device. The bias voltage range of interest is from about 1V (high distortion) to 5V (low distortion). The inductors shown in FIGS. 9A and 9B are for biasing; they should have sufficient inductance to block RF (e.g., 2 μH). A typical RF input level for these circuits, for use in a CATV system is −28 dBm/ch.

Figure 10A:
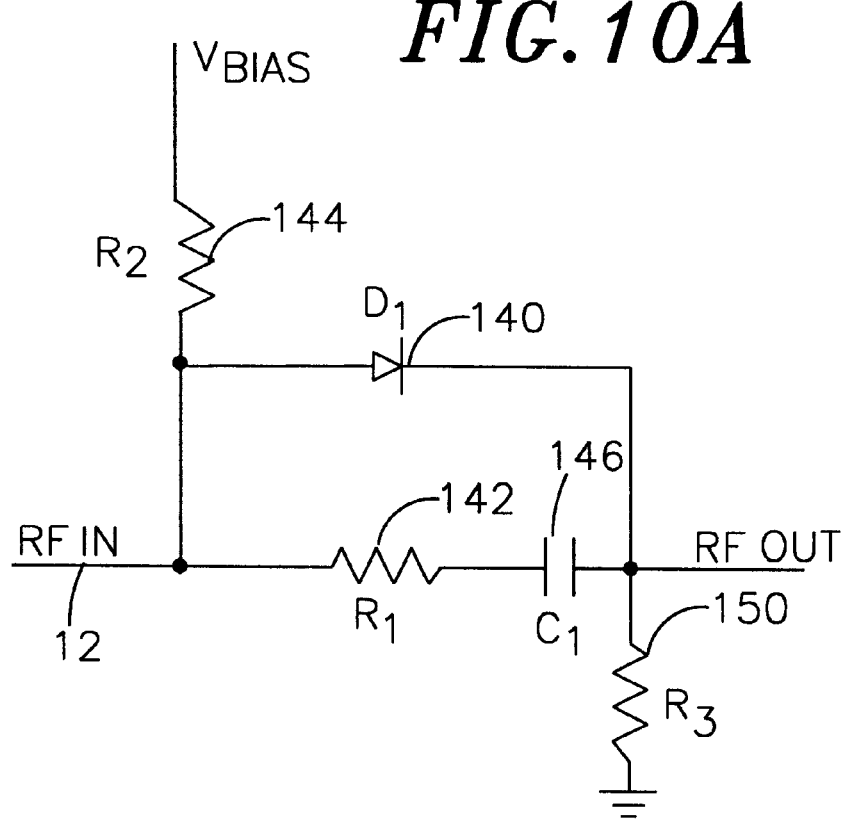
FIG. 10A is a schematic diagram of a circuit including a parallel combination of a diode and a resistor for producing primarily a real component of predistortion.
Figure 10B:
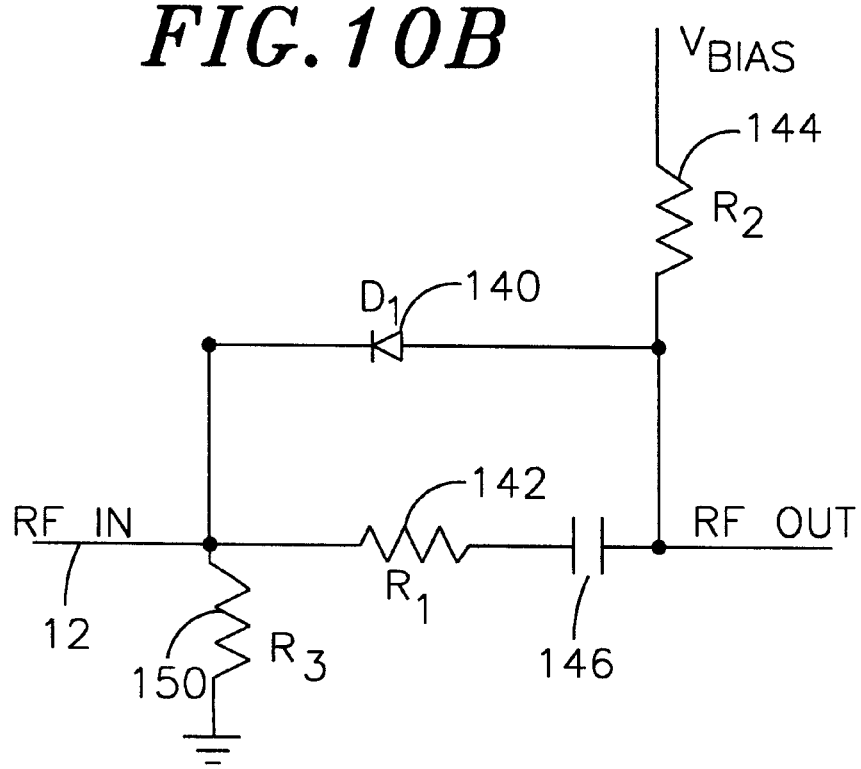
FIG. 10B is an alternate embodiment of the circuit of FIG. 10A.

Referring to FIGS. 10A and 10B, in yet another embodiment, the real component of the predistortion signal is produced by the parallel combination of a diode 140(D1) and a resistor 142(R1), connected in series with the RF signal path. Like reference numerals are used in FIGS. 10A and 10B to designate like components. The magnitude of the predistortion is adjustable by changing the DC bias current supplied to the device.

The resistor R1 in FIGS. 10A and 10B is typically some fraction of the characteristic impedance of the circuit. In operation, the RF currents flowing through resistor R1 cause RF voltages to appear across the diode.

The differential resistance of the diode decreases when the forward voltage across the diode increases. Thus, in FIG. 10A, a positive voltage swing in the RF signal will momentarily decrease the insertion loss of the circuit. The resistors 144(R2) and 150(R3) are used to provide bias to the diode; capacitor 146(C1) is a DC-blocking capacitor. FIG. 10B differs from FIG. 10A only in that the second-order distortion is of the opposite polarity, since in FIG. 10B, a positive voltage swing in the RF signal will momentarily increase the insertion loss of the circuit.

Microwave Schottky diodes have been found to provide satisfactory results in the circuits of FIGS. 10A and 10B. Typical values for R1, P2, R3, and C1, in a 75 ohm CATV system driving a laser transmitter, are 20 ohms, 100 kiloohms, 100 kiloohms, and 0.01 uF. The values however, should be chosen to compensate for the real component of distortion of the non-linear device. A typical RF signal level at the input to the circuit is −33 dBm/channel.

Figure 11A:
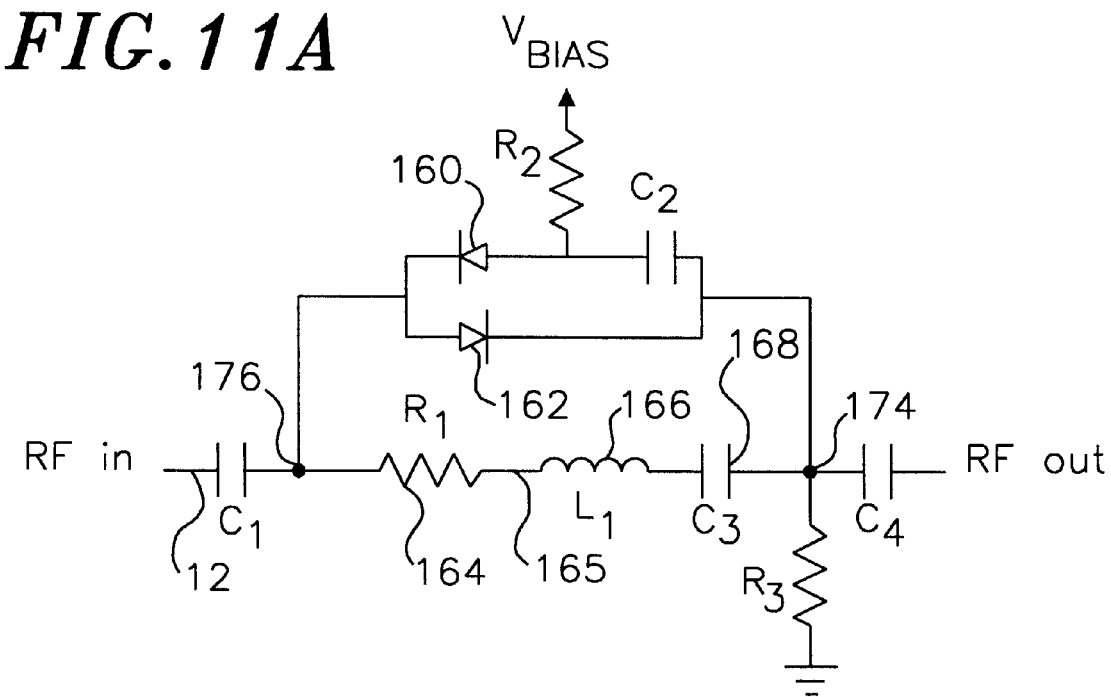
FIG. 11A is a schematic diagram of a circuit for generating frequency dependent third-order distortion.
Figure 11B:
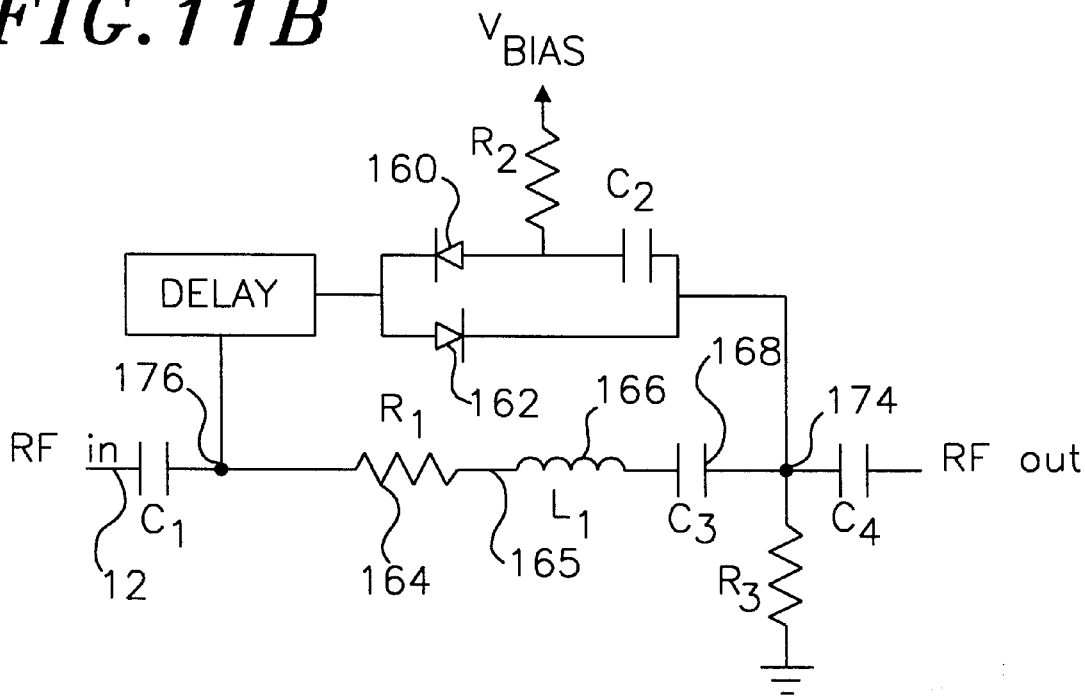
FIG. 11B is an alternate embodiment of the third-order distortion circuit of FIG. 11A.

Referring to FIGS. 11A and 11B, additional circuits according to the present invention are disclosed for generating frequency dependent predistortion. The embodiments of FIGS. 11A and 11B are for generating frequency dependent third-order distortion. The predistortion generated by these circuits varies as a function of the input frequencies and distortion frequencies. Like reference numerals are used to designate like parts in FIGS. 11A and 11B. Each circuit consists of an antiparallel pair of diodes 160, 162 connected in parallel with a resistor 164(R1) and in series with the signal path 165. The circuit may also include one or more inductor 166(L1), capacitor 168(C1), or delay line 170 elements connected to or inserted into the circuit. The reactive elements cause the predistortion generated by the circuit to be frequency-dependent, and this has been found to improve the circuit's ability to linearize some transmitters and amplifiers.

In operation, current flows through each of the diodes as a non-linear function of the voltage across each diode. In the circuit of FIG. 11A, the presence of the inductor 166 (L1) causes the phase of the voltage across the diodes to lead the phase of the signal at the output 174 of the predistorter. It also causes the phase of the signal at the output to lag the signal at the input 176, and it further causes the predistortion voltage at the output to lead the non-linear currents produced in the diode. The net result is that at the output, the predistortion leads the signal. This effect is larger at high frequencies, where the impedance of the inductor is larger. For the same reason, the magnitude of the predistortion is larger for high input frequencies, since the voltage drop across the inductor (which contributes to the total voltage drop across the diodes) is larger.

Referring to FIG. 11B, the delay line 170 causes the input signal reaching one end of the diode pair to be delayed in phase relative to the signal reaching the other end of the diode pair, and the latter signal is attenuated by the series resistor 164. Because the voltage across each diode equals the difference between the signals at the two ends of the diode pair, the phase delay of the voltage across the diodes relative to the input voltage considerably exceeds the time delay produced by the delay line. In addition, the predistortion produced by the diode pair is further delayed in reaching the output because a fraction of it must travel back through the delay line. In this circuit, the net result of introducing the delay line is to retard the phase of the predistortion relative to the signal. The relative phase lag is larger at higher frequencies, since the delay introduced by the delay line corresponds to a greater fraction of a cycle at these frequencies. In addition, the magnitude of the predistortion is larger at higher frequencies since at these frequencies the signals at the two ends of the diode pair, having an increased phase difference, have a larger vector difference, and cause a larger voltage to appear across the diode pair.

In the circuits of FIGS. 11A and 11B, microwave Schottky diodes have been found to provide satisfactory performance. For a CATV system including a laser, typical bias currents are on the order of 20 $\mu A$. Typical values for resistor R1, inductor L1, and delay line 170 are 20 ohms, 3 nH, and 0.1 nsec, respectively. The resistors R2 and R3 are used to bias the diodes and must be large compared to the characteristic impedance of the circuit (e.g., 10 kiloohms to 100 kiloohms). The capacitors C1, C2, C3 and C4 are DC-blocking capacitors of order 0.01 $\mu F$. In practice, the values chosen should be suitable to cancel the distortion produced by the nonlinear device.

The invention described is not limited to any particular application. For example, although described and illustrated in the context of a TV signal modulating a laser or light emitting diode, other nonlinear devices such as amplifiers may have inherent distortion largely canceled by this technique. Also, the same principle of in-line distortion cancellation may be used, for example, in a receiver, in which case the distortion devices may be downstream of the nonlinear device. Because of such variations, the invention may be practiced other than as specifically described.

In general, the distortion of a non-linear device can be characterized by the following equations:
Second Order Distortion $$\text{Real CSO}=A_0+A_1f+A_2f^2+A_3f^3+\ldots+A_nf^n \quad (4)$$

$$\text{Imag CSO}=B_0+B_1f+B_2f^2+B_3f^3+\ldots+B_nf^n \quad (5)$$

Third Order Distortion $$\text{Real CTB}=C_0+C_1f+C_2f^2+C_3f^3+\ldots+C_nf^n \quad (6)$$

$$\text{Imag CTB}=D_0+D_1f+D_2f^2+D_3f^3+\ldots+D_nf^n \quad (7)$$

where CSO stands for Composite Second Order and CTB stands for Composite Triple Beat.

For most devices used for the transmission of broadband signals, such as multi-channel video, the non-linear characteristics are well compensated by matching only a few distortion terms in the series, such as, for example, $A_0$, $A_1$, $B_1$, $C_0$, $C_1$ and $D_1$.

In the in-line predistorter of the present invention, the desired real and imaginary distortion terms may be synthesized by summing the distortion contributions from several different distorter elements. In the simplest case, one distorter produces a constant real distortion, another produces distortion proportional to frequency, f, and so on. However, it is not essential to have the simplest set of distorters. Distorters with more complex distortion characteristics can be used so long as they provide an independent set.

By way of example, in a case where only coefficients $A_0$, $A_1$ and $B_1$ are required for adequate distortion compensation, the necessary predistortion can be produced with three distorter elements that produce distortion with the following characteristics:

Distorter 1:

$$\text{Real second order distortion}=k_1(A_{01}+A_{11}f) \quad (8)$$

$$\text{Imag second order distortion}=k_1B_{11}f \quad (9)$$

Distorter 2:

$$\text{Real second order distortion}=k_2(A_{02}+A_{12}f) \quad (10)$$

$$\text{Imag second order distortion}=k_2B_{12}f \quad (11)$$

Distorter 3:

$$\text{Real second order distortion}=k_3(A_{03+A13}f) \quad (12)$$

$$\text{Imag second order distortion}=k_3B_{13}f \quad (13)$$

Each distorter has an adjustable scaling factor $k_i$ and can be characterized by a set of coefficients ($A_{0i}$, $A_{1i}$, $B_{1i}$). As long as these coefficient vectors are linearly independent, the distorters form an independent set that can be used to synthesize any arbitrary distortion characteristic defined by the three coefficients.

The same reasoning can be extended to more complicated distortion characteristics. To synthesize any arbitrary distortion characteristic with n nonzero coefficients, n distorters with independent distortion characteristics are preferred.

FIGS. 12–21 illustrate exemplary in-line predistorters circuits that can be used as building blocks for generating the desired predistortion using a combination of in-line elements. The circuits in FIGS. 12–16 are for generating primarily second order distortion, and the circuits in FIGS. 17–21 are for generating primarily third order distortion. The circuits fall generally into two separate classes, one including a Schottky diode as the basic distortion producing component, and the other including a varactor diode as the basic distortion producing component.

A Schottky diode connected in parallel with a resistance element in the main RF signal path ideally produces distortion that is generally in phase with the voltage across it. A varactor connected between the RF signal path and ground, ideally produces complementary distortion that varies as a function of frequency and is 90 degrees out of phase with the voltage applied to it. By configuring different in-line circuits that include the basic components, it is possible to generate distortion that is sufficient to compensate for the non-linear characteristics of most devices used for the transmission of broadband signals.

Figure 12:
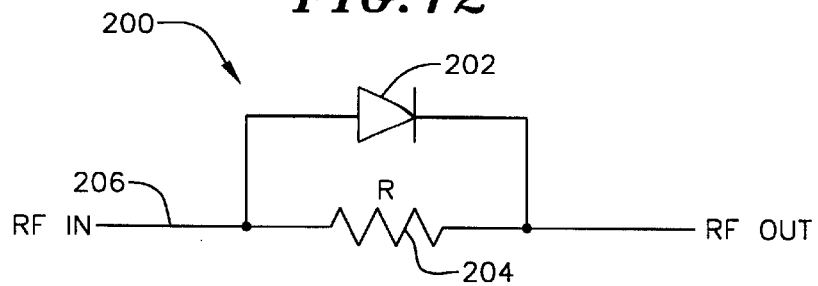
FIGS. 12, 12A, 13–21 illustrate exemplary in-line predistorters circuits that can be used as building blocks, either by themselves, or in combination with any of the circuits disclosed herein, for generating the desired predistortion using a combination of in-line elements.

Referring to FIG. 12, an in-line circuit 200 is shown for generating primarily constant (frequency independent) real second order distortion for cases in which coefficient $A_0$ in equation (4) is nonzero. The circuit includes a Schottky diode 202 and a resistor 204 connected in parallel across the RF signal path 206. In operation, the voltage across the resistor and Schottky diode varies as the RF signal varies. As the voltage increases, the diode starts to conduct and the combined resistance of the resistor and diode drops. Corresponding losses are reduced and real second order distortion is generated in-phase with the RF signal.

Figure 12A:
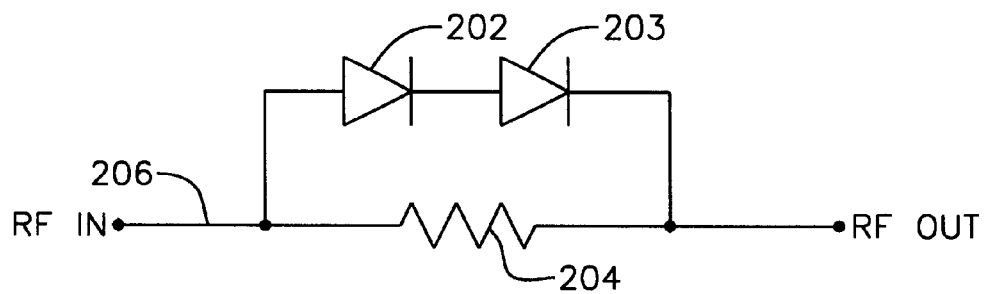

The circuit of FIG. 12a is an alternate embodiment of the circuit of FIG. 12, the primary difference between the circuits being the incorporation of a second Schottky diode 203 in series with Schottky diode 202 in FIG. 12a. It has been found in practice that the desired distortion depends upon the signal level at the diode. Assuming a 75 ohm load, it has been found that desirable distortion is achieved between approximately 0 volts, below which the diode acts as an open circuit, and 1 volt, above which the diode acts as a short circuit, and more particularly, where the diode begins to turn on, in the vicinity of approximately 0.2–0.3 volts. In order to adjust the signal level across the diode, the resistor 204 can be modified. However, below a certain value of resistor 204, increased series inductance may detrimentally affect circuit performance. The use of two diodes in series allows for a resistor of twice the value, because the signal is split across the two diodes. It will be understood by those of ordinary skill in the art that additional configurations involving a plurality of diodes may be used in any one of the following circuits depending on the signal level at the circuit and desired distortion.

Figure 13:
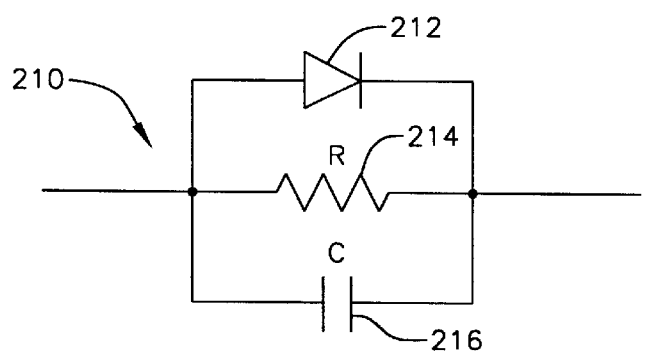
Figure 14:
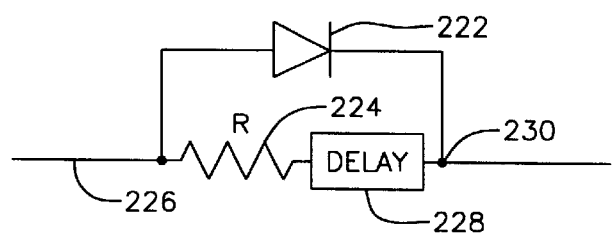

In situations in which $A_0$ and $B_1$ are nonzero in equations (4) and (5), respectively (i.e., there is a real constant component and an imaginary component that varies with frequency), the in-line circuits of FIGS. 13 or 14 may be used. In FIG. 13, the circuit 210 includes a Schottky diode 212, resistor 214 and capacitor 216 all connected in parallel in the RF signal path. The capacitor delays the signal on the parallel path so that the voltage across the Schottky diode is delayed with respect to the main RF signal. Since the Schottky diode produces distortion that is in-phase with the voltage across it, the circuit produces distortion that is out of phase with the main RF signal. Accordingly, the resulting distortion includes real and imaginary parts, with the real part equal to A cosine $\omega T$, and the imaginary part equal to A sine $\omega T$. The particular amount of real and imaginary parts depends on frequency, with the amount of imaginary distortion increasing with increases in frequency.

The in line circuit 220 of FIG. 14 includes a Schottky diode 222 and resistor 224 connected in parallel in the RF signal path 226, with a time delay 228 in series with the resistor. The time delay can be implemented, for example, by displacing the connection 230 from the resistor so that the signal path is longer. The circuit produces both real and imaginary distortion similar to that of the circuit of FIG. 13.

Figure 15:
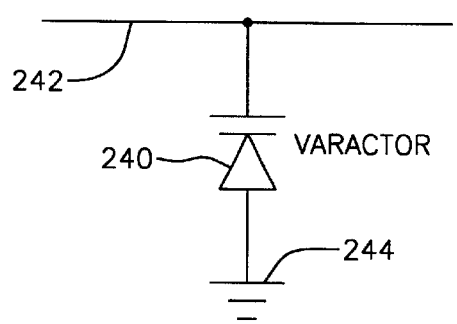

To produce primarily imaginary second order distortion in cases where $B_1$. in equation (5) is nonzero, the in-line circuit 238 of FIG. 15 includes a varactor 240 connected between the main signal path 242 and ground 244. The varactor produces distortion that is ideally 90 degrees out of phase with the RF signal.

Figure 16:
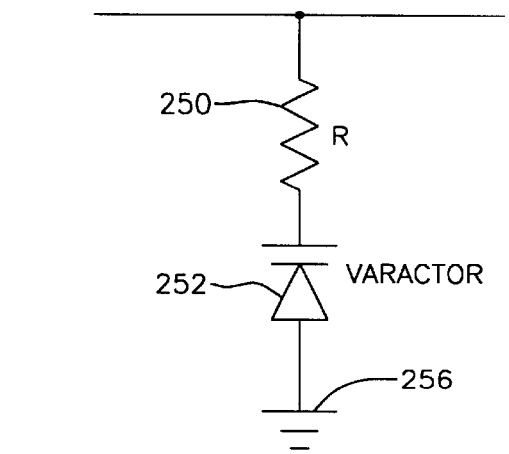

For producing both real and imaginary distortion in cases where $A_0$ and $B_1$ are nonzero, the circuit 248 of FIG. 16 includes a resistor 250 connected in series with the varactor 252 between the main signal path 254 and ground 256. By introducing the resistor, the signal applied across the varactor is caused to be out of phase with the RF signal. Accordingly, the circuit produces distortion that deviates from purely imaginary distortion and includes both real and imaginary parts.

Exemplary in-line circuits for generating third order distortion are shown in FIGS. 17–21. Each of the circuits preferably includes at least one pair of antiparallel diodes, either Schottky-type or varactor-type. In operation, a single Schottky or varactor diode produces primarily second order distortion and generally a lower level of third order distortion. The two polarities of the diodes produce the same third order distortion but opposite signs of second order distortion. Accordingly, placing the diodes in the antiparallel configuration essentially cancels the second order distortion and generates twice the amount of third order distortion as a single diode. Similar to the case of a single diode for generating second order distortion, the Schottky diode pair produces ideally real (in-phase) third order distortion and the varactor pair produces imaginary third order distortion that is ideally 90 degrees out of phase with the voltage applied to it.

Figure 17:
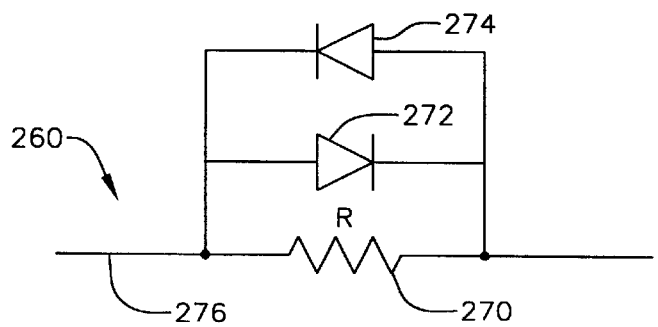

The circuit 260 of FIG. 17 produces primarily real constant third order distortion for cases in which $C_0$ is nonzero in equation (6). The circuit includes a resistor 270 and a pair of antiparallel Schottky diodes 272, 274 connected in parallel in the RF signal path 276. The antiparallel diodes produce third order distortion that is in-phase with the voltage across them, which, in this case, is also substantially in-phase with the RF signal.

Figure 18:
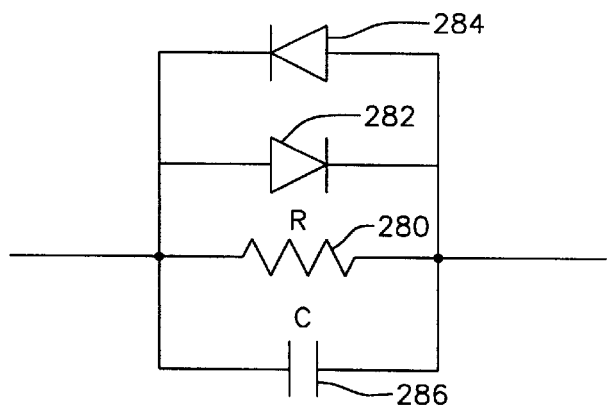

The circuit 278 of FIG. 18 produces both real and imaginary components of third order distortion for cases in which the coefficients $C_0$ and $D_1$ are nonzero in equations (6) and (7) respectively. The circuit includes a resistor 280, antiparallel Schottky diodes 282, 284, and a capacitor 286 connected in parallel in the RF signal path 288. Similar to the second order distortion circuit of FIG. 13, the capacitor tends to delay the signal across the diodes. Accordingly, the circuit produces third order distortion that is out of phase with the RF signal.

Figure 19:
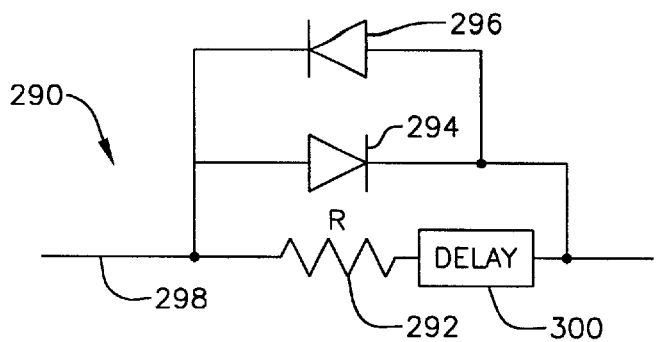

The circuit 290 of FIG. 19 also produces both real and imaginary components of third order distortion for cases in which the coefficients $C_0$ and $D_1$ are nonzero in equations (6) and (7), respectively. The circuit includes a resistor 292 and antiparallel diodes 294, 296 connected in parallel in the RF signal path 298 with a time delay 300 connected in series with the resistor. Similar to the circuit of FIG. 17, the time delay causes the distortion produced by the Schottky pair to be out of phase with the RF signal, thereby also generating both real and imaginary components of distortion.

Figure 20:
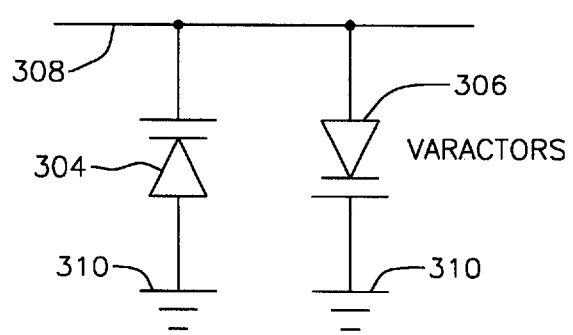

The circuit 302 of FIG. 20 generates ideally imaginary distortion for cases in which $D_1$ is nonzero in equation (7). The in-line circuit includes a pair of oppositely directed varactor diodes 304, 306 connected between the RF signal path 308 and ground 310. Together, the antiparallel varactor diodes generate third order distortion that is approximately 90 degrees out of phase with the RF signal, thereby generating primarily imaginary distortion.

Figure 21:
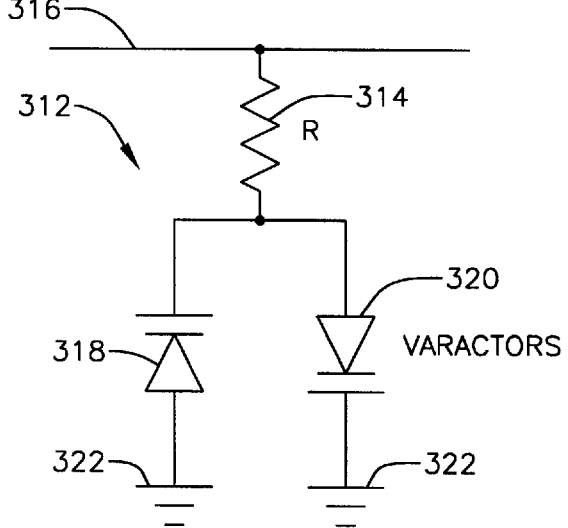

The circuit 312 of FIG. 21 generates both real and imaginary distortion for cases in which $C_1$ and $D_1$ are nonzero in equations (6) and (7), respectively. The circuit includes a resistor 314 connected to the main RF signal path 316 and two oppositely directed varactor diodes 318, 320 connected to ground 322. Similar to the circuit of FIG. 11, the resistor alters the phase of the signal across the varactor diodes, making it out of phase with the RF signal on the main signal path. Accordingly, the circuit produces third order distortion that is out of phase with the signal on the main signal path.

The in-line circuits of FIGS. 12–21 can be used alone or in a serial combination to generate the desired distortion for a particular nonlinear device. Ideally, the simplest way to obtain the desired real and imaginary distortion is to use the basic Schottky and varactor diode circuits of FIG. 12 and 15. In practice, however, the Schottky diode circuit of FIG. 12 does not produce purely real distortion, but instead produces distortion that is advanced or delayed relative to the main RF signal, i.e. includes some imaginary component. Accordingly, in practice, the circuits of FIGS. 13 and 14 are presently preferred because the capacitor 216 (FIG. 13) and/or time delay 228 (FIG. 14) can be used to essentially tune the circuit by compensating for any undesired imaginary components.

Figure 22:
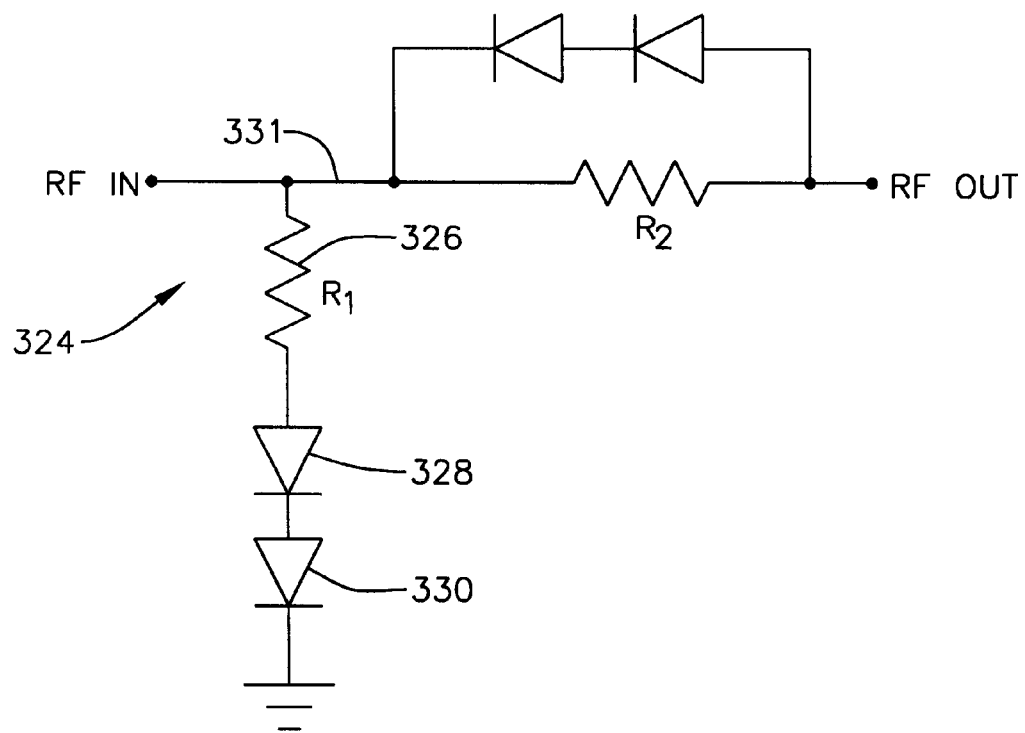
FIG. 22 is a diagram of a circuit for substantially canceling undesired third order distortion generated by second order distortion circuit.

Referring to FIG. 22, a circuit is disclosed for cancellation of undesired third order distortion generated by second order distortion circuit. The circuit includes a first section 324 for producing sublinear CSO and compressive CTB, and a second section 325 for producing sublinear CSO and expansive CTB. The first section includes a resistor R1 326 and a pair of Schottky diodes 328, 330 connected between the RF signal path 331 and ground. When the RF signal goes low and the diodes turn off, the section looks like high impedance. When the RF signal goes high and the diode turns on, RF attenuation increases, resulting in mostly CSO and some CTB. The second section 325 is similar to the circuit of FIG. 12a above, and includes first and second serially coupled Schottky diodes 332, 334 connected in parallel with resistor R2 336. By appropriately choosing components in the sections, the CTB is decreased to a fixed amount that is less than the CTB that would be produced independently by either section. It is known that the sign of CSO can be changed by reversing the direction of the diodes in the circuits.

Those of ordinary skill in the art would also know that numerous variations can be made to the circuits described above without departing from the scope of the present invention. For example, any of the circuits discussed herein can be combined to provide the building blocks of an effective in-line circuit. Any number of well known biasing elements can also be included as necessary for proper operation.

What is claimed is:

1. An in-line predistorter circuit for generating predistortion that can be used to substantially cancel or reduce the distortion from a nonlinear device, the circuit comprising an RF signal path carrying an RF signal input to the nonlinear device, and a plurality of in-line distortion producing circuit elements placed in sequence along the RF signal path, wherein real and imaginary distortion, sufficient to substantially cancel or reduce the distortion from a nonlinear device, is synthesized by additively combining the distortion contributions from the combination of in-line distortion producing circuit elements, wherein no separation of the RF signal into a fundamental signal path and a separate and distinct distortion producing path occurs within the in-line distortion producing circuit elements.

2. The in-line predistorter of claim 1 wherein at least one of the in-line circuit elements comprises a Schottky diode and a resistor connected in parallel across the RF signal path, wherein voltage across the resistor and Schottky diode varies as the RF signal varies, and wherein the circuit element generates primarily constant, frequency independent, real second order distortion.

3. The in-line predistorter of claim 1 wherein at least one of the in-line circuit elements comprises first and second serially coupled Schottky diodes connected in parallel with a resistor across the RF signal path, wherein the voltage across the resistor and Schottky diodes varies as the RF signal varies, and wherein the circuit element generates primarily constant, frequency independent, real second order distortion.

4. The in-line predistorter of claim 1 wherein at least one of the in-line circuit elements comprises a Schottky diode, resistor and capacitor all connected in parallel in the RF signal path, wherein the circuit element produces both real and imaginary distortion.

5. The in-line predistorter of claim 1 wherein at least one of the in-line circuit elements comprises a first section for producing sublinear CSO and compressive CTB, and a second section for producing sublinear CSO and expansive CTB, wherein the additive contribution of CTB by each section of the circuit results in the substantial reduction of CTB.

6. The in-line predistorter of claim 1 wherein at least one of the in-line circuit elements comprises a resistor and a pair of antiparallel Schottky diodes connected in parallel in the RF signal path, wherein the circuit element produces primarily real constant third order distortion.

7. The in-line predistorter of claim 1 wherein at least one of the in-line circuit elements comprises a resistor, antiparallel diodes, and a capacitor connected in parallel in the RF signal path, wherein the circuit produces both real and imaginary components of third order distortion.

8. An in-line predistorter circuit for generating predistortion that can be used to substantially cancel or reduce the distortion from a nonlinear device, the circuit comprising:
an RF signal path carrying an RF signal input to the nonlinear device, and a plurality of in-line distortion producing circuit elements placed in sequence along the RF signal path,
wherein real and imaginary distortion, sufficient to substantially cancel or reduce the distortion from a nonlinear device, is synthesized by additively combining the distortion contributions from the combination of in-line distortion producing circuit elements, and
wherein at least one of the in-line circuit elements comprises a Schottky diode connected in parallel with a resistor across the RF signal path, with a time delay in series with the resistor, wherein the circuit element produces both real and imaginary distortion.

9. An in-line predistorter circuit for generating predistortion that can be used to substantially cancel or reduce the distortion from a nonlinear device, the circuit comprising:
an RF signal path carrying an RF signal input to the nonlinear device, and a Plurality of in-line distortion producing circuit elements placed in sequence along the RF signal path,
wherein real and imaginary distortion, sufficient to substantially cancel or reduce the distortion from a nonlinear device, is synthesized by additively combining the distortion contributions from the combination of in-line distortion producing circuit elements, and
wherein at least one of the in-line circuit elements comprises a varactor connected between the main signal path and ground, wherein the circuit element produces primarily imaginary second order distortion.

10. An in-line predistorter circuit for generating predistortion that can be used to substantially cancel or reduce the distortion from a nonlinear device, the circuit comprising:
an RF signal path carrying an RF signal input to the nonlinear device, and a plurality of in-line distortion producing circuit elements placed in sequence along the RF signal path,
wherein real and imaginary distortion, sufficient to substantially cancel or reduce the distortion from a nonlinear device, is synthesized by additively combining the distortion contributions from the combination of in-line distortion producing circuit elements, and
wherein at least one of the in-line circuit elements comprises a resistor and antiparallel diodes connected in parallel in the RF signal path with a time delay connected in series with the resistor, wherein the circuit produces both real and imaginary components of third order distortion.

11. An in-line predistorter circuit for generating predistortion that can be used to substantially cancel or reduce the distortion from a nonlinear device, the circuit comprising:
an RF signal path carrying an RF signal input to the nonlinear device, and a plurality of in-line distortion producing circuit elements placed in sequence along the RF signal path, wherein real and imaginary distortion, sufficient to substantially cancel or reduce the distortion from a nonlinear device, is synthesized by additively combining the distortion contributions from the combination of in-line distortion producing circuit elements, and wherein at least one of the in-line circuit elements comprises a pair of oppositely directed varactor diodes connected between the RF signal path and ground, wherein the circuit produces imaginary third order distortion.

12. An in-line predistorter circuit for generating predistortion that can be used to substantially cancel or reduce the distortion from a nonlinear device, the circuit comprising:

an RF signal path carrying an RF signal input to the nonlinear device, and a plurality of in-line distortion producing circuit elements placed in sequence along the RF signal path, wherein real and imaginary distortion, sufficient to substantially cancel or reduce the distortion from a nonlinear device, is synthesized by additively combining the distortion contributions from the combination of in-line distortion producing circuit elements, and wherein at least one of the in-line circuit elements comprises a resistor connected to the main RF signal path and two oppositely directed varactor diodes connected to ground, wherein the circuit produces third order distortion that is out of phase with the signal on the main signal path.

13. An in-line predistorter circuit for generating predistortion that can be used to substantially cancel or reduce the distortion from a nonlinear device, the circuit comprising:

an RF signal path carrying an RF signal input to the nonlinear device, and a plurality of in-line distortion producing circuit elements placed in sequence along the RF signal path, wherein real and imaginary distortion, sufficient to substantially cancel or reduce the distortion from a nonlinear device, is synthesized by additively combining the distortion contributions from the combination of in-line distortion producing circuit elements, and wherein at least one of the in-line circuit elements comprises a resistor connected in series with the varactor 252 between the RF signal path and ground, wherein the circuit element produces distortion that includes both real and imaginary parts.

* * * * *